(12) United States Patent
Pirk et al.

(10) Patent No.: US 9,195,054 B2
(45) Date of Patent: Nov. 24, 2015

(54) CASCADED MICROMECHANICAL ACTUATOR STRUCTURE

(75) Inventors: Tjalf Pirk, Stuttgart (DE); Stefan Pinter, Reutlingen (DE); Joerg Muchow, Reutlingen (DE); Joachim Fritz, Tuebingen (DE); Christoph Friese, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1205 days.

(21) Appl. No.: 13/124,468

(22) PCT Filed: Aug. 24, 2009

(86) PCT No.: PCT/EP2009/060865
§ 371 (c)(1),
(2), (4) Date: Jun. 28, 2011

(87) PCT Pub. No.: WO2010/046154
PCT Pub. Date: Apr. 29, 2010

(65) Prior Publication Data
US 2011/0248601 A1 Oct. 13, 2011

(30) Foreign Application Priority Data

Oct. 20, 2008 (DE) .......................... 10 2008 042 967

(51) Int. Cl.
*H02N 1/06* (2006.01)
*G02B 26/08* (2006.01)
(Continued)

(52) U.S. Cl.
CPC ............ *G02B 26/0833* (2013.01); *B81B 3/004* (2013.01); *G02B 26/0841* (2013.01); *H02N 1/006* (2013.01); *B81B 2201/033* (2013.01); *B81B 2203/058* (2013.01)

(58) Field of Classification Search
CPC ................. H02N 1/008; B81B 3/0037; B81B 2201/033; B81B 2203/058; B81B 3/004; G02B 26/0833; G02B 26/0841
USPC ........................ 310/300, 309; 359/225.1, 291, 359/223–226, 298, 872
See application file for complete search history.

(56) References Cited

U.S. PATENT DOCUMENTS 6,445,107 B1 * 9/2002 Jeong et al. .................... 310/309
7,123,400 B2 * 10/2006 Murakami et al. ............ 359/298
(Continued)

FOREIGN PATENT DOCUMENTS

DE 102008003344 7/2009
FR 2907775 5/2008
(Continued)

OTHER PUBLICATIONS

International Search Report, PCT International Patent Application No. PCT/EP2009/060865 dated Sep. 30, 2009.

*Primary Examiner* — Hanh Nguyen
*Assistant Examiner* — Leda Pham
(74) *Attorney, Agent, or Firm* — Kenyon & Kenyon LLP

(57) ABSTRACT

A cascaded micromechanical actuator structure for rotating a micromechanical component about a rotation axis is described. The structure includes a torsion spring device which, on the one hand, is attached to a mount and to which, on the other hand, the micromechanical component is attachable. The torsion spring device has a plurality of torsion springs which run along or parallel to the rotation axis. The structure includes a rotary drive device having a plurality of rotary drives which are connected to the torsion spring device in such a way that each rotary drive contributes a fraction to an overall rotation angle of a micromechanical component about the rotation axis.

14 Claims, 5 Drawing Sheets

(51) Int. Cl.
*B81B 3/00* (2006.01)
*H02N 1/00* (2006.01)

(56) References Cited

U.S. PATENT DOCUMENTS

| | | | |
|---|---|---|---|
| 7,161,274 B2* | 1/2007 | Tsuboi et al. | 310/309 |
| 7,508,111 B2* | 3/2009 | Ko et al. | 310/309 |
| 2005/0035682 A1* | 2/2005 | Tsuboi et al. | 310/309 |
| 2006/0120425 A1* | 6/2006 | Kouma et al. | 372/43.01 |
| 2006/0198006 A1 | 9/2006 | Kato et al. | |
| 2009/0273255 A1* | 11/2009 | Maeda et al. | 310/308 |
| 2010/0085622 A1 | 4/2010 | Hofmann et al. | |

FOREIGN PATENT DOCUMENTS

| | | |
|---|---|---|
| JP | 2005-88188 | 4/2005 |
| JP | 2005-208578 | 8/2005 |
| JP | 2006-525548 | 11/2006 |
| JP | 2007-171780 | 7/2007 |
| WO | WO 2008/071172 | 6/2008 |

* cited by examiner a)

b)

US 9,195,054 B2

CASCADED MICROMECHANICAL ACTUATOR STRUCTURE

FIELD OF THE INVENTION

The present invention relates to a cascaded micromechanical actuator structure.

BACKGROUND INFORMATION

Although the present invention is applicable to any micromechanical component, the present invention is explained on the basis of actuators for micromirrors.

Micromirrors are used for deflecting optical beams, for example in bar code scanners, projection systems or for switching optical data links. There are two basic modes of operation for micromirror deflection. In the resonant mode of operation, a natural frequency of the micromirror is induced. This permits very high mirror inclination angles at low energy injection levels.

The disadvantage is that the oscillation frequency is always set to the range around the micromirror resonance frequency, and the oscillation therefore always describes a sinusoidal function. In projection applications, this causes a poor distribution of the image intensity, since the beam scans the center of the image very quickly, while it scans the edge of the image very slowly.

For two-dimensional scanners, a Lissajous figure is also typically employed. This means that a great deal of computing power is needed during image preparation for controlling the projection laser. The image resolution does not achieve the levels that would result from the horizontal oscillation frequency of the micromirror in line-by-line projection. In addition, an image which is "chaotically" structured in this manner is unpleasant for the viewer, since it appears to disintegrate when the viewer moves his/her head quickly.

For line-by-line projection of video images, in which these problems do not occur, a micromirror which may be statically or quasi-statically excited on at least one axis is required. Since the electrostatic force may have only an attracting effect, but not a repelling effect, electrode structures on one plane, which are frequently used for resonant micromirrors, are unusable. In contrast, the electrodes on different planes are suitable for implementing a quasi-static electrostatic drive. Several approaches exist for this purpose.

PCT Application No. WO 2008-071172 describes a micromirror actuator which has, in an inner region, at least one movable micromirror element and multiple finger-shaped or comb-shaped electrodes for activating the micromirror, which are offset against each other in height, the actuator being formed from a layer structure having at least three main layers, at least sections of which are electrically insulated from each other by intermediate layers. This type of system of comb electrodes on parallel planes located on top of each other is also known as an OOP comb system (out-of-plane combs).

German Patent Application No. DE 10 2008 003 344.8 describes angled, vertical combs as a micromirror actuator, the combs being structured on one plane and subsequently predeflected from the plane.

The torque generally increases as the application of force moves farther away from a rotation axis. In electrostatic actuators which execute a tilting motion of a structure from a plane, for example against a spring, the vertical comb structures or finger structures should therefore be located as far as possible from the rotation axis. However, this has limits, since the achievable deflection depends on the distance between the electrode pairs (rotor and stator) and the rotation axis at a given depth of OOP comb electrodes. The greater the distance between the electrodes and the rotation axis, the sooner does the rotor disengage from the stator. Since no further energy gain is achievable from this point on, this point corresponds to the maximum deflection. In other words, the maximum deflection is lower in OOP electrode structures located at a greater distance from the rotation axis than it is in OOP electrode structures located closer to the rotation axis.

FIGS. 8a and 8b are schematic cross-sectional views of two comb electrode teeth for illustrating a conventional micromechanical comb drive structure.

In FIGS. 8a and 8b, reference numeral E1 designates a first plane on which is provided a comb electrode having comb electrode teeth Fd which may rotate or swivel around an anchoring point V, the comb electrode being located parallel to a second comb electrode, which has stationary comb electrode teeth Ff and which is provided on a second underlying plane E2. Planes E1, E2 are located parallel to each other.

Upon application of a voltage U, comb electrode teeth Fd are inserted into stationary comb electrode teeth Ff. This causes an energy reduction, since the overlapping area of the two electrodes Ff, Fd is enlarged during insertion. A corresponding torque therefore arises at rotatable comb electrode Fd. The torque curve is stable up to angle α illustrated in FIG. 8b, at which rotatable comb electrode Fd is fully introduced into stationary comb electrode Ff. The area overlap no longer increases uniformly beyond angle α. On the bottom, rotatable comb electrode Fd reemerges from the overlap at angles greater than α. This is apparent in the torque curve by a strong drop in torque.

This discussion clearly shows that angle of inclination α has a limit for OOP comb electrodes which is defined by the length and height of the comb electrode fingers. High comb electrodes permit a large angle of inclination, but are more difficult to manufacture than low comb electrode fingers, which are manufactured, for example, in a trench-etching process. The use of long comb electrode fingers may greatly increase the torque, while possible deflection angle α decrease along with the finger length.

FIG. 9 is a schematic cross-sectional view of a conventional micromechanical comb drive structure for a rotary drive of a micromirror.

In FIG. 9, reference numeral VS designates a mount, for example a stationary region of a substrate. A comb electrode rotary drive A is connected via a torsion spring f0, a micromirror S, which is rotatable about a rotation axis DA0, along which torsion spring f0 runs and provides a corresponding restoring torque, being attached to the other side of the comb electrode rotary drive. Comb electrode rotary drive A includes a first rotatable comb electrode Da having rotatable comb electrode teeth Fd and a diametrically opposed, second rotatable comb electrode Db having rotatable comb electrode teeth Fd. Rotatable comb electrodes Da, Db interact with corresponding stationary comb electrodes Fa, Fb, which are also attached to mount VS and have stationary comb electrode teeth Ff. With reference to FIG. 8, rotatable comb electrodes Da, Db are located on plane E1, and stationary comb electrodes Fa, Fb are located on plane E2.

By applying a voltage difference U between first rotatable comb electrode Da and first stationary comb electrode Fa or at second rotatable comb electrode Db and second stationary comb electrode Fb, a rotation around rotation axis DA0 is possible, by an angle of up to +α or −α in each case (see FIG. 8).

SUMMARY

In accordance with the present invention, the required maximum deflection angle of individual regions may be reduced by cascading multiple rotary drives, which makes it possible to optimize the distance between the electrodes and the rotation axis. Among other things, this enables higher torques or lower drive voltages to be achieved and to reduce the space requirements for the drive.

Drive regions may be cascaded along the rotation axis (axially) or radially to the rotation axis and thereby the load on the individual regions may be reduced due to a reduced maximum deflection. In the case of axial cascading, the comb electrodes are located at varying distances from the rotation axis and are connected by adapted spring elements. Each corresponding drive region generates either more torque at a smaller deflection angle or a greater deflection at a lower torque.

In the case of radial cascading, an intermediate plane is introduced via a frame. The actuator is deflected relative to the frame, and the frame is deflected relative to the chip, which proportionally reduces the particular maximum deflection angle, depending on the design.

The smaller deflection angle per rotary drive enables the individual regions to be more effectively adapted to their position and function on the component. This may be used, for example, for a higher torque, a lower drive voltage, better use of space on the chip (reduced space requirements overall) or a larger deflection angle on the actual actuator.

According to a preferred refinement, the torsion spring device has a first torsion spring, the first end of which is attached to the mount, the rotary drive device having a first rotary drive, which is attached between the second end of the first torsion spring and a first end of a second torsion spring, and the rotary drive device having a second rotary drive which is attached to the second end of the second torsion spring.

In a further preferred refinement, the first rotary drive has a first rotatable comb electrode system and a first stationary comb electrode system cooperating therewith, the first rotatable comb electrode system being situated on a first plane and the first stationary comb electrode system being situated on a second plane, the second rotary drive having a second rotatable comb electrode system and a second stationary comb electrode system cooperating therewith, the second rotatable comb electrode system being situated on the first plane and the second stationary comb electrode system being situated on the second plane, and the first rotatable comb electrode system and the first stationary comb electrode system interacting therewith being situated at a greater distance from the rotation axis than the second rotatable comb electrode system and the second stationary comb electrode system cooperating therewith.

In a further preferred refinement, the rotary drive device has a rotatable comb electrode system and a stationary comb electrode system cooperating therewith, the rotatable comb electrode system being situated on a first plane, and the stationary comb electrode system being situated on a second plane, the rotatable comb electrode system being attached to the mount via the torsion spring device, comb teeth of the rotatable comb electrode system being attached to the torsion spring device and dividing it into individual intermediate torsion springs, and a length of comb teeth of the rotatable comb electrode system decreasing gradually along the rotation axis, starting from the mount side, thereby causing one rotary drive to be formed between two torsion springs in each case.

In a further preferred refinement, the first rotary drive has a third rotatable comb electrode system and a third stationary comb electrode system cooperating therewith, the third rotatable comb electrode system being situated on a first plane and the third stationary comb electrode system being situated on a second plane, the second rotary drive having a fourth rotatable comb electrode system and a fourth stationary comb electrode system cooperating therewith, the fourth rotatable comb electrode system being situated on the first plane and the fourth stationary comb electrode system being situated on the second plane, and the fourth stationary comb electrode system being connected to the third rotatable comb electrode system via a first frame in such a way that the fourth stationary comb electrode rotates together with the third rotatable comb electrode system on the first plane.

In a further preferred refinement, the torsion spring device has a third and fourth torsion spring which are attached to the mount by their particular first ends parallel to each other and parallel to the rotation axis, the rotary drive device having a third rotary drive which is attached to the particular second ends of the third and fourth torsion springs, the torsion spring device having a fifth torsion spring which is attached to the mount by its first end, the rotary drive device having a fourth rotary drive which is attached to the second end of the fifth torsion spring.

In a further preferred refinement, the third rotary drive has a fifth rotatable comb electrode system and a fifth stationary comb electrode system cooperating therewith, the fifth rotatable comb electrode system being situated on a first plane and the fifth stationary comb electrode system being situated on a second plane, the fourth rotary drive having a sixth rotatable comb electrode system and a sixth stationary comb electrode system interacting therewith, the sixth rotatable comb electrode system being situated on the first plane and the sixth stationary comb electrode system being situated on the second plane, and the sixth stationary comb electrode system being connected to the fifth rotatable comb electrode system via a second frame in such a way that the sixth stationary comb electrode rotates together with the fifth rotatable comb electrode system on the first plane.

In a further preferred refinement, the fourth rotary drive has a seventh stationary comb electrode system and a seventh rotatable comb electrode system cooperating therewith, the seventh rotatable comb electrode system being situated on the first plane and the seventh stationary comb electrode system being situated on the second plane, and the seventh stationary comb electrode system being connected to the fifth rotatable comb electrode system via the second frame in such a way that the seventh stationary comb electrode system rotates together with the fifth rotatable comb electrode system on the first plane.

In a further preferred refinement, the plurality of torsion springs have different spring constants.

In a further preferred refinement, the cascaded micromechanical actuator structure according to the present invention is connected to a micromirror as the micromechanical component.

In a further preferred refinement, the rotary drive device has a plurality of electrodes which are designed as dual electrodes on a first and a second plane and thus permit angular deflection in two directions.

BRIEF DESCRIPTION OF THE DRAWINGS

Exemplary embodiments of the present invention are illustrated in the figures and explained in greater detail below.

DETAILED DESCRIPTION OF EXAMPLE EMBODIMENTS

Figure 1:
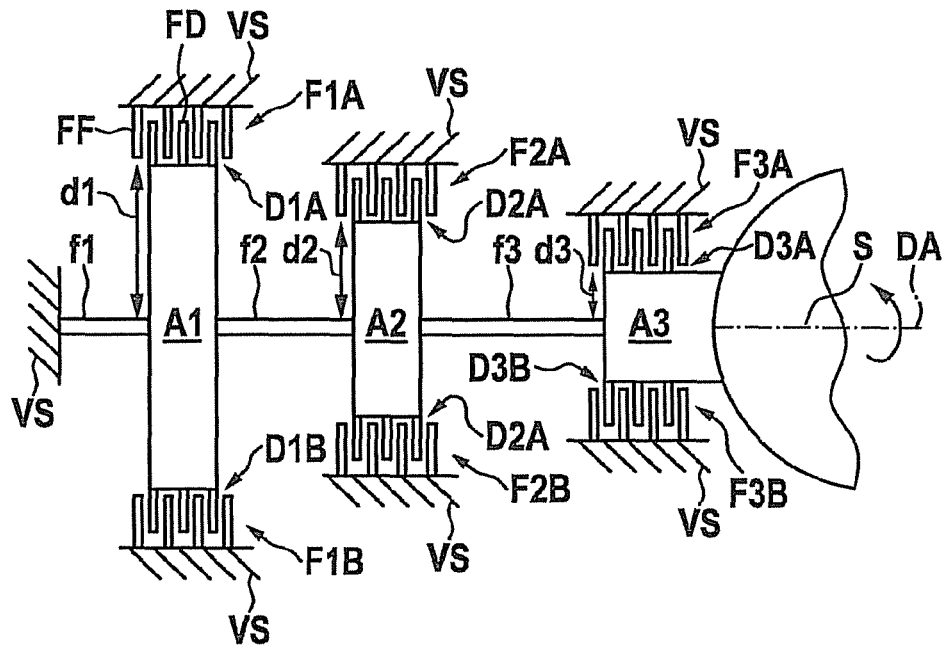
FIG. 1 shows a schematic cross-sectional view of a cascaded micromechanical actuator structure according to a first specific embodiment of the present invention.

In the figures, the same reference numerals designate identical or functionally identical components.

FIG. 1 is a schematic cross-sectional view of a cascaded micromechanical actuator structure according to a first specific embodiment of the present invention.

In FIG. 1, three rotary drives A1, A2, A3 are cascaded or connected in series in the axial direction. First rotary drive A1 is connected to a mount VS, for example a semiconductor substrate, via a first torsion spring f1, which runs along rotation axis DA. First rotary drive A1 has a first rotatable comb electrode system D1A, D1B, which is provided on diametrically opposed sides of a central region at a first distance d1 from rotation axis DA. Rotatable comb electrode system D1A, D1B has a plurality of comb electrode teeth FD. A stationary comb electrode system F1A, F1B, which cooperates with rotatable comb electrode system D1A, D1B, is provided on diametrically opposed sides, comb electrode teeth FF of stationary comb electrode system F1A, F1B being located between fingers FD of rotatable comb electrode system D1A, D1B.

A second rotary drive A2, whose bilaterally rotatable comb electrode system D2A, D2B and stationary comb electrode system F2A, F2B are situated at a distance d2 from rotation axis DA, is connected to first rotary drive A1 via a second torsion spring f2 which runs along rotation axis DA, distance d2 being shorter than distance d1.

Likewise, a third rotary drive A3 is connected to a second rotary drive A2 via a third torsion spring f3 which runs along rotation axis DA, stationary comb electrode system F3A, F3B and rotatable comb electrode system D3A, D3B of the third rotary drive being located even closer to rotation axis DA, at a distance d3. A micromirror S, which is only partially shown, is connected to third rotary drive A3.

Figure 8:
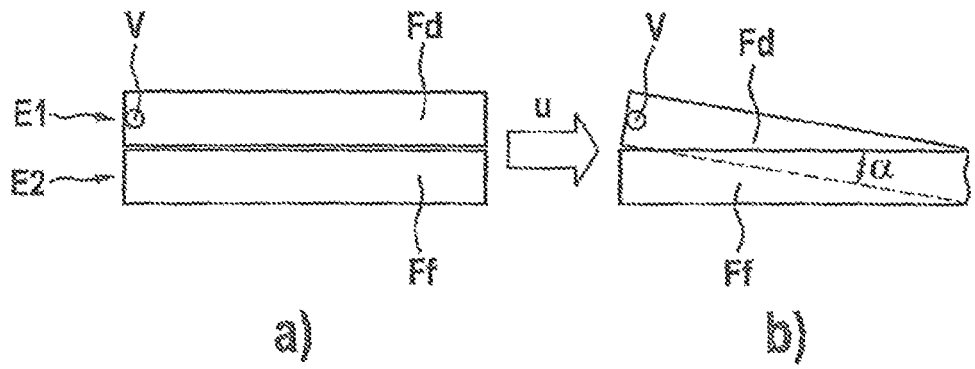
FIGS. 8a, 8b show schematic cross-sectional views of two comb electrode teeth for illustrating a known micromechanical comb electrode structure.

Rotary drives A1, A2, A3 and their rotatable comb electrode systems are located on a plane E1 which lies above a plane E2 of the stationary comb electrode systems (see FIG. 8).

If a voltage is now applied, for example, to rotatable comb electrode system D1A and stationary comb electrode system F1A of first rotary drive A1, rotatable comb electrode system D1A is inserted into fixed comb electrode system F1A. However, since second and third rotary drives A2, A3 have comb electrode systems which are located closer to rotation axis DA, a predeflection takes place in this location, but without rotating electrode systems D2A, D3A being fully inserted into corresponding stationary comb electrode systems F2A and F3A.

If a voltage is similarly applied to stationary comb electrode system F2A and rotatable comb electrode system D2A of second rotary drive A2, full insertion also takes place in this location and third rotary drive A3 is further predeflected.

Due to a voltage applied to third stationary comb electrode system F3A and third rotatable comb electrode system D3A, the third rotary drive is finally deflected under a low torque by a small residual angle to achieve the total deflection angle.

Figure 9:
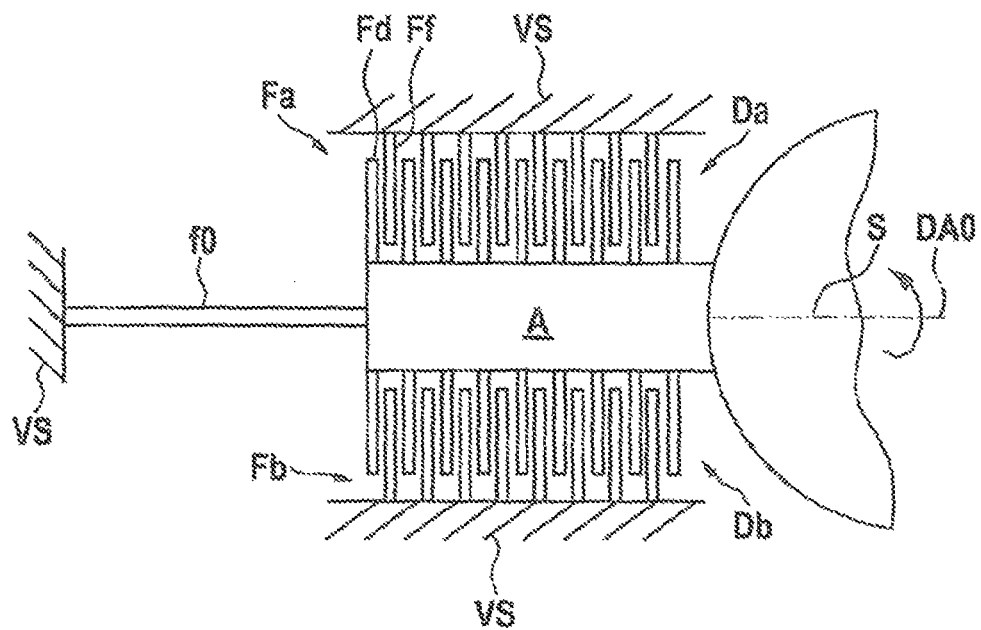
FIG. 9 shows a schematic cross-sectional view of a conventional micromechanical comb drive structure for a rotary drive of a micromirror.

The forces to be applied to the three rotary drives A1, A2, A3 in this specific embodiment are lower, compared to the conventional rotary drive shown in FIG. 9, since they are distributed to three rotary drives.

In this first specific embodiment, optimization may be achieved by the fact that all three rotary drives A1, A2, A3 contribute an identical angle deflection, after which the spring constants of torsion springs f1, f2, f3 are adjusted accordingly. Alternatively, it is also possible to provide an adjusted torque while maintaining the same spring constants of torsion springs f1, f2, f3.

Figure 2:
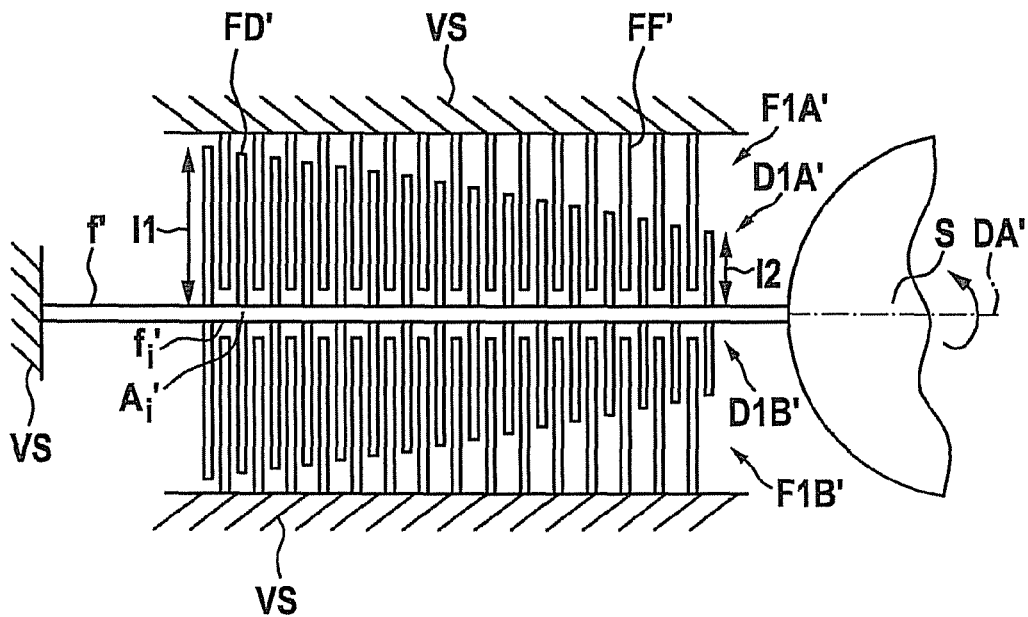
FIG. 2 shows a schematic cross-sectional view of a cascaded micromechanical actuator structure according to a second specific embodiment of the present invention.

FIG. 2 is a schematic cross-sectional view of a cascaded micromechanical actuator structure according to a second specific embodiment of the present invention.

In the second specific embodiment according to FIG. 2, a torsion spring f' is provided, via which a rotatable comb electrode system D1A', D1B is attached to mount VS. Comb electrode teeth FD' of rotatable comb electrode system D1A', D1B' interact with comb electrode teeth FF' of a stationary comb electrode system F1A', F1B', which is also attached to mount VS and which, as in the first specific embodiment, is provided on a lower plane E2 than rotatable comb electrode system D1A', D1B'. Micromirror S is attached to torsion spring f' on the right side of comb electrode system D1A', D1B'.

In this specific embodiment, the length of the comb electrode teeth decreases continuously from an initial length l1 to a final length l2, starting from mount VS toward micromirror S along rotation axis DA'. After comb electrode teeth FD' of rotatable comb electrode system D1A', D1B' have been attached to torsion spring f', they divide the torsion spring into individual torsion springs $f_i'$ over the length of comb electrode system D1A', D1B', thereby causing one rotary drive $A_i'$ to be formed between two torsion springs $f_i'$ in each case.

Each finger FD' thus drives torsion spring f' a little farther into the maximum deflection angle and thereby results in a predeflection of following finger FD'. As illustrated, maximum distance DL between fingers FD' and third rotation axis DA' is preferably shortened as the deflection of torsion spring f' increases, to achieve successively higher maximum deflections of differential drives $A_i'$ until reaching the desired deflection angle of micromirror S. Once again, the maximum insertion angle of fingers FD' into fingers FF' is limited by fixed plane E2 of stationary comb electrode system F1A', F1B'.

It is also possible to select an optimized intermediate solution between the first specific embodiment according to FIG. 1 and the second specific embodiment according to FIG. 2.

Figure 3:
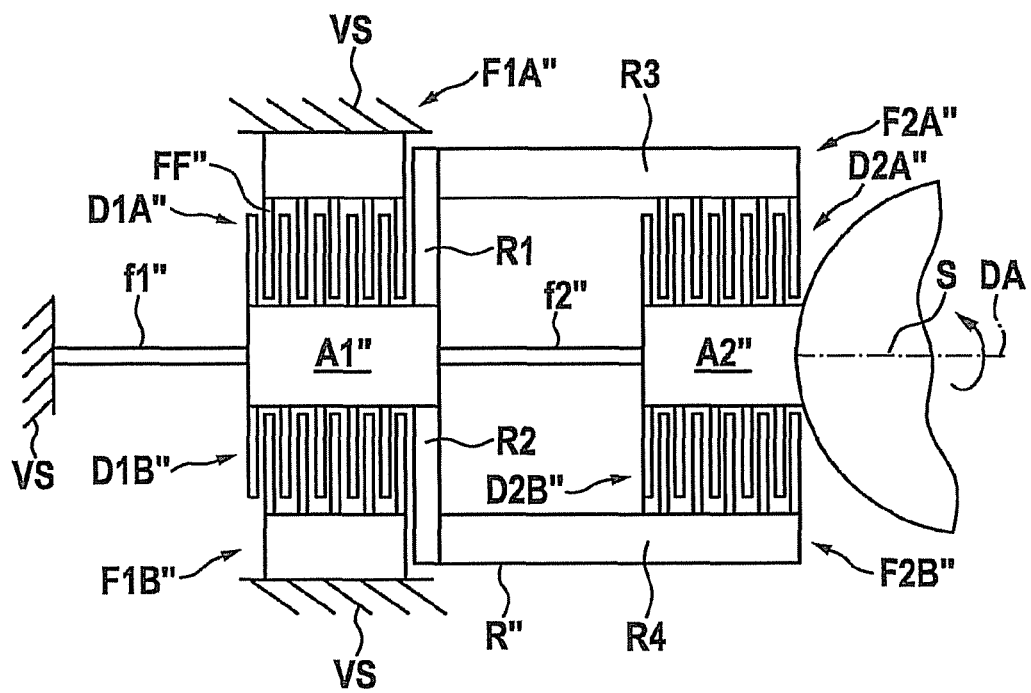
FIG. 3 shows a schematic cross-sectional view of a cascaded micromechanical actuator structure according to a third specific embodiment of the present invention.

FIG. 3 is a schematic cross-sectional view of a cascaded micromechanical actuator structure according to a third specific embodiment of the present invention.

In the third specific embodiment illustrated in FIG. 3, two cascaded rotary drives A1", A2", each having comb electrode systems, are provided. First rotary drive A1" has a rotatable comb electrode system D1A", D1B", which is connected to mount VS via a torsion spring f1". In cooperation with this rotatable comb electrode system D1A", D1B", a stationary comb electrode system F1A", F1B" is provided, which is attached to mount VS and is located on lower plane E2. A second stationary comb electrode system F2A", F2B" is connected to first rotary drive A1" via a frame R".

In regions R1 and R2, frame R" is guided or stepped from upper plane E1 to lower plane E2. Regions R3 and R4 are located on lower plane E2. Alternatively and for stability reasons, R" may also be provided on both planes E1 and E2, and only the fingers of stationary comb electrode system F2A" and F2B" are located on lower plane E2.

As a result of this structure, second stationary comb electrode system F2A" is predeflected by the first rotary drive and therefore no longer represents a fixed stator plane E2. In other words, the relative arrangement of fixed comb electrode system F2A" and F2B" and rotatable comb electrode system D1A", D1B" remain under the influence of first rotary drive (in contrast to the first specific embodiment).

Second rotary drive A2" is connected to first rotary drive A1" via a second torsion spring f2" and has a second rotatable comb electrode system D2A", D2B", which cooperates with predeflectable, second stationary comb electrode system F2A", F2B". Rotating mirror S is attached to second rotary drive A2".

In this specific embodiment, each rotary drive A1", A2" must be deflected around rotation axis DA" by the same relative angle, while individual rotary drive A1", A2" must drive only a smaller angle. The torque can therefore be increased, and the sum of the required rotary drives decreases.

A further specific embodiment (not illustrated) partially integrates the torsion springs into drive region A1" by placing the starting point, for example, right in the middle of the central region. This makes it possible to reduce the axial length and thus also the tendency toward unwanted oscillation modes. In FIG. 3, two rotary drives A1", A2" are cascaded and further steppings are, of course, possible. This specific embodiment requires slightly more complexity compared to the first or second specific embodiment, since the number of supply lines running over torsion springs f1", f2" is higher because stator regions F2A" and F2B" must also be contacted thereby.

Figure 4:
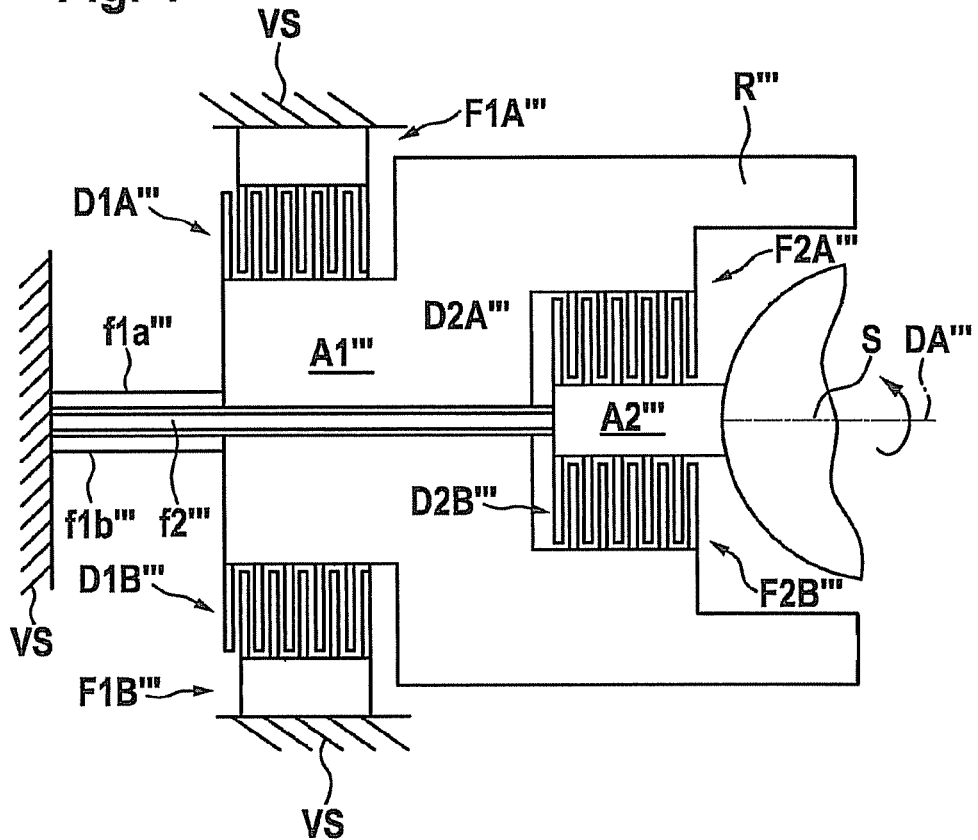
FIG. 4 shows a schematic cross-sectional view of a cascaded micromechanical actuator structure according to a fourth specific embodiment of the present invention.
Figure 5:
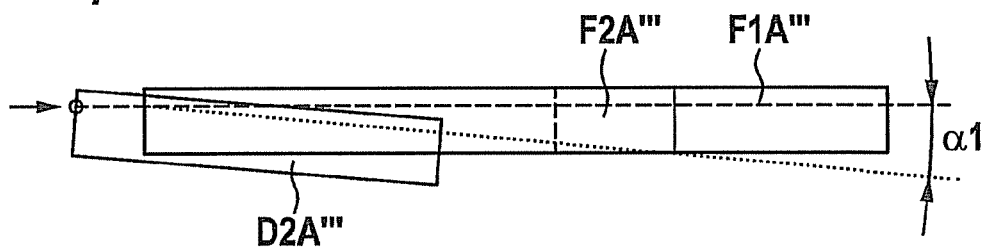
FIGS. 5a, 5b show schematic cross-sectional views for illustrating the deflection behavior of the cascaded micromechanical actuator structure according to the fourth specific embodiment of the present invention.
Figure 5:
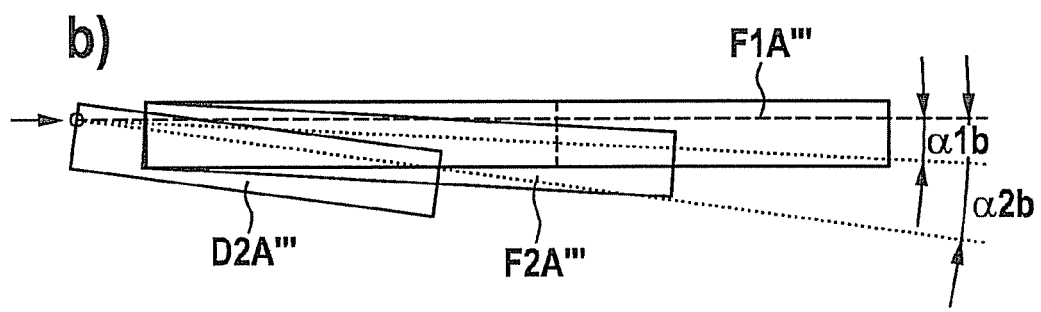

FIG. 4 is a schematic cross-sectional view of a cascaded micromechanical actuator structure according to a fourth specific embodiment of the present invention, and FIGS. 5a and 5b are schematic cross-sectional views for illustrating the deflection behavior of the cascaded micromechanical actuator structure according to the fourth specific embodiment of the present invention.

In the fourth specific embodiment, a first rotary drive A1''' and a second rotary drive A2''' are provided, which, however, are connected in parallel. First rotary drive A1''' is connected to mount VS via torsion springs f1a''', f1b''', which run parallel to rotation axis DA''' at a distance therefrom. First rotary drive A1''' has a rotatable comb electrode system D1A''', D1B''' and a stationary comb electrode system F1A''', F1B''', the latter being provided on a lower plane E2, as in the other exemplary embodiments.

Second rotary drive A2''', to which micromirror S is attached, is connected to mount VS via a separate torsion spring f2''' and is rotatable independently of first rotary drive A1'''. A rotatable comb electrode system D2A''', which cooperates with a stationary comb electrode system F2A''' which is connected to first rotary drive A1''' via a frame R''', is provided for this purpose. Second stationary comb electrode system F2A''', F2B''' is located on first plane E1 of first rotary drive A1'''.

In this specific embodiment, comb electrode teeth of rotatable comb electrode system D2A''', according to FIG. 5a, are deflected in relation to second stationary comb electrode system F2A''', and frame R''' is in the idle position. Due to smaller angle α1a of the comb electrode teeth of rotatable comb electrode system D2A''' in relation to frame R''', of, for example, 5° as opposed to, for example, 7° without a cascaded drive, the comb electrode teeth of rotatable comb electrode system D2A''' may be placed at a greater distance from rotating axis DA''' and generate a higher torque. By additionally actuating frame R''' against the remaining chip via first rotatable comb electrode system D1A''' in cooperation with first stationary electrode system F1A''', the total target angle may be achieved, represented in this case as α2 in FIG. 5b. Target angle α2 is typically smaller than the sum of α1a and α1b. In the illustrated example, angle α1a is 5° and angle α1b is 3°, while angle α2 is approximately 7° to 8°. Drives A1''', A2''' should be dimensioned according to the total elastic and driving forces.

Due to the low relative deflections of the driving combs in relation to frame R3''' or in relation to the stationary comb electrode systems, the distances from rotation axis DA''', and thus the achievable torques, may be increased.

Figure 6:
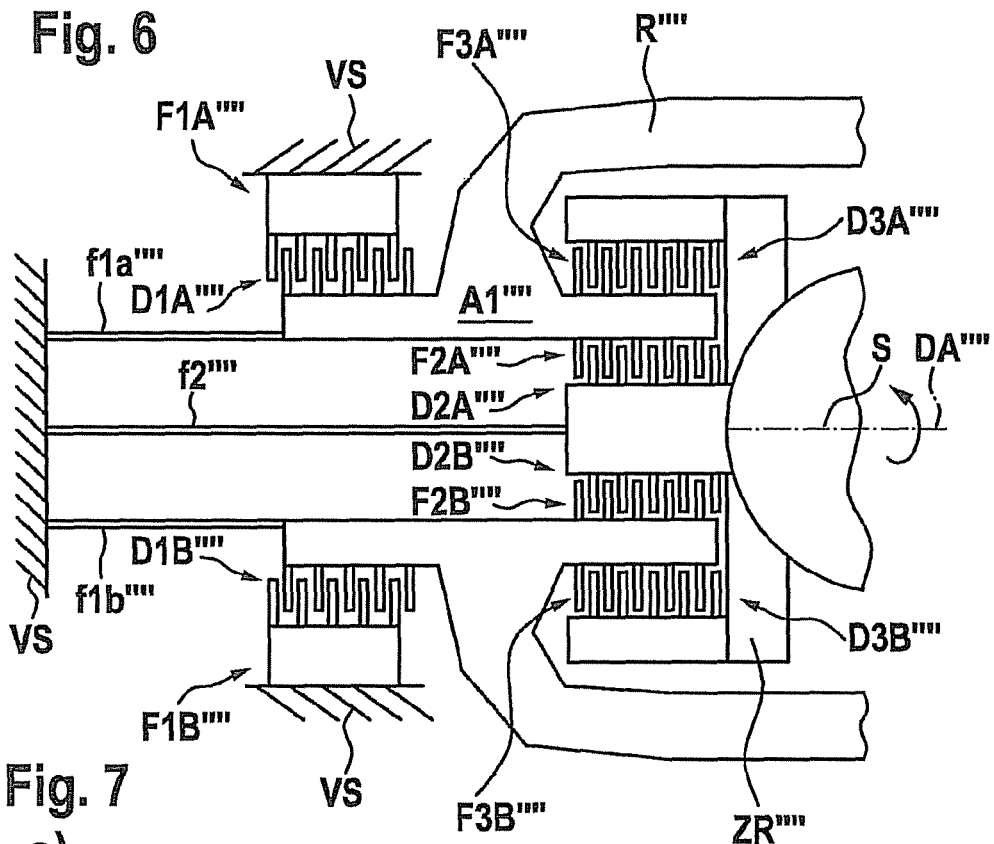
FIG. 6 shows a schematic cross-sectional view of a cascaded micromechanical actuator structure according to a fifth specific embodiment of the present invention.
Figure 7:
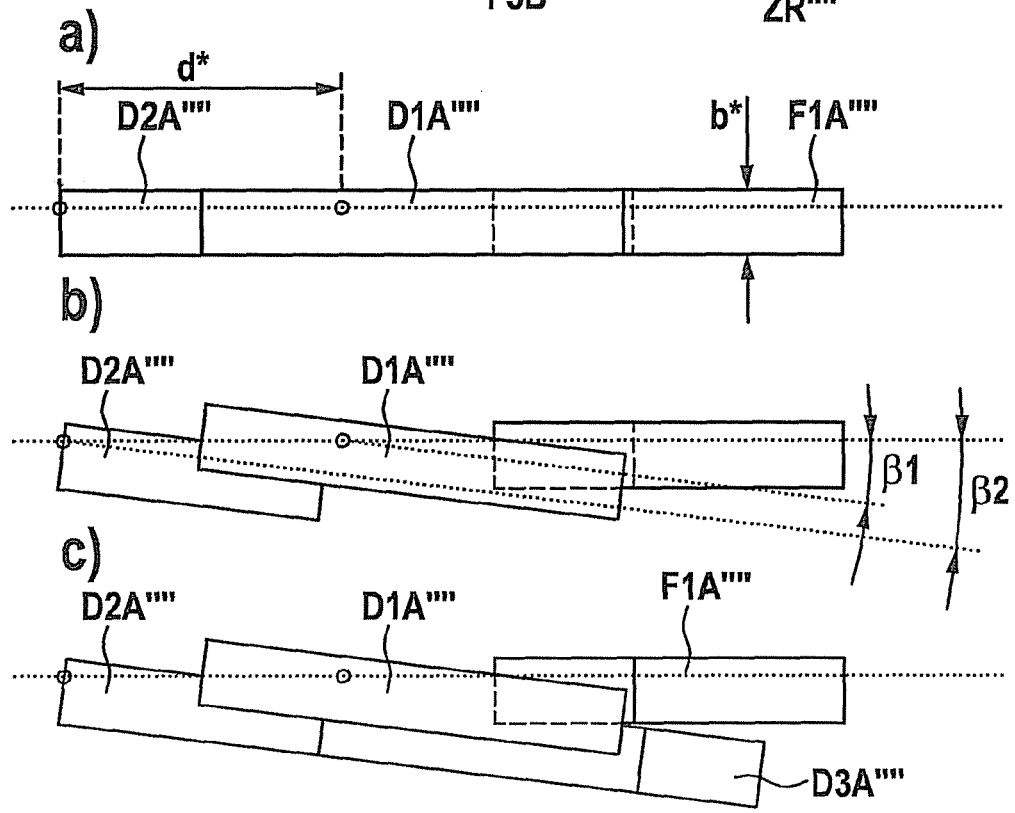
FIG. 7 shows schematic cross-sectional views for illustrating the deflection behavior of the cascaded micromechanical actuator structure according to the fifth specific embodiment of the present invention.

FIG. 6 is a schematic cross-sectional view of a cascaded micromechanical actuator structure according to a fifth specific embodiment of the present invention, and FIG. 7 shows schematic cross-sectional views for illustrating the deflection behavior of the cascaded micromechanical actuator structure according to the fifth specific embodiment of the present invention.

In the fifth specific embodiment according to FIG. 6, a first and a second rotary drive A1'''', A2'''' are likewise provided.

As in the fourth specific embodiment, first rotary drive A1'''' is connected to mount VS via a first and a second torsion spring f1A'''', f1B''''. The first rotary drive has a first rotatable comb electrode system D1A'''', D1B'''', which cooperates with a first stationary comb electrode system F1A'''', F1B'''', which are provided on lower plane E2.

A second stationary comb electrode system F2A'''', F2B'''' is attached to first rotary drive A1'''' via a frame R'''', the second stationary comb electrode system cooperating with a second rotatable comb electrode system D2A'''', D2B'''' of second rotary drive A2'''', second rotary drive A2'''' being connected to mount VS via a torsion spring f2''''. In this respect, the fifth specific embodiment resembles the fourth specific embodiment according to FIG. 4.

A third stationary comb electrode system F3A'''', F3B'''', which is also provided on frame R'''' and cooperates with a third rotatable comb electrode system D3A'''', D3B'''', is also provided in the fifth specific embodiment, the third rotatable comb electrode system being connected to the second rotating drive A2'''' via a further frame ZR''''.

With reference to FIGS. 7a through 7c, frame R'''' in this specific embodiment is predeflected by an angle B1, starting from the idle position according to FIG. 7a, due to the cooperation of first rotatable comb electrode system D1A'''' with first stationary comb electrode system F1A''''. In a subsequent step, second rotatable comb electrode system D2A'''' is also deflected in relation to first rotatable comb electrode system D1A'''', which results in a deflection by angle B2.

Due to the shift in rotation axis DA4'''' of the torsion element and frame R'''' by magnitude d*/tan (maximum target angle), a complete overlap between an upper and a lower layer over cross-connected dual electrodes at the maximum target angle is achieved, as shown in FIG. 7b). This overlap not only affects axial regions, but also the entire frame and the entire torsion element. However, electrode combs which are not located between the two rotation axes do not attract each other, but are guided past each other. At the target angle, this also results in an energy minimum using a cross-connection, and driving combs therefore contribute to the deflection all over frame R''''. However, combs at a distance from the axis may only contribute to the deflection, but the direction of deflection must be specified by the combs close to the axis. The increase in the overlapping area per angle is independent of the distance to the rotation axis; the increase in torque is therefore linear in relation to the number of combs even away from the rotation axis in the radial direction. However, the fingers do not completely leave the stator and therefore may not become hooked. This is illustrated for rotating fingers D3A'''' in FIG. 7c.

Although the present invention is described above on the basis of preferred exemplary embodiments, it is not limited thereto, but may be modified in many different ways.

Although the micromechanical component to be deflected was a micromirror in the exemplary embodiments described above, the micromechanical actuator structure according to the present invention may also be applied to other micromechanical components to be deflected.

Furthermore, a plate electrode structure or another electrode structure may be used for excitation instead of the finger electrode structure.

In principle, the above specific embodiments are each described as having individual electrode drives, i.e., rotating and stationary finger electrodes on a first and a second plane in each case. However, this permits a deflection, for example only of the frame or the micromechanical component in one direction. All exemplary embodiments may also be achieved by dual electrodes in which the rotating and stationary finger electrodes are each provided on both planes, yet also as regions which are electrically insulated from each other. By appropriately connecting the different regions, a deflection in both directions may be achieved.

What is claimed is:

1. A cascaded micromechanical actuator structure for rotating a micromechanical component about a rotation axis, comprising:
   a torsion spring device which is attached to a mount and to which the micromechanical component is attachable, the torsion spring device having a plurality of torsion springs which run one of along or parallel to the rotation axis; and
   a rotary drive device having a plurality of rotary drives which are connected to the torsion spring device in such a way that each of the rotary drives is suitable for contributing a fraction to a total rotation angle of the micromechanical component about the rotation,
   wherein the torsion spring device has a first torsion spring, a first end of the first torsion spring being attached to the mount, the rotary drive device has a first rotary drive attached between a second end of the first torsion spring and a first end of a second torsion spring, the rotary drive device has a second rotary drive attached between a second end of a second torsion spring and the micromechanical component so that the torsion spring device and the rotary drive device are provided between the mount and the micromechanical component, the first rotary drive has a first rotatable comb electrode system and a first stationary comb electrode system cooperating therewith, and the second rotary drive has a second rotatable comb electrode system and a second stationary comb electrode system cooperating therewith.

2. The cascaded micromechanical actuator structure as recited in claim 1, wherein the first rotatable comb electrode system is situated on a first plane, and the first stationary comb electrode system is situated on a second plane, the second rotatable comb electrode system is situated on the first plane, and the second stationary comb electrode system is situated on the second plane, and the first rotatable comb electrode system and the first stationary comb electrode system cooperating therewith are situated at a greater distance from the rotation axis than the second rotatable comb electrode system and the second stationary comb electrode system cooperating therewith.

3. A cascaded micromechanical actuator structure for rotating a micromechanical component about a rotation axis, comprising:
   a torsion spring device which is attached to a mount and to which the micromechanical component is attachable, the torsion spring device having a plurality of torsion springs which run one of along or parallel to the rotation axis; and
   a rotary drive device having a plurality of rotary drives which are connected to the torsion spring device in such a way that each of the rotary drives is suitable for contributing a fraction to a total rotation angle of the micromechanical component about the rotation axis,
   wherein the rotating drive device has a rotatable comb electrode system and a stationary comb electrode system cooperating therewith, the rotatable comb electrode system being situated on a first plane and the stationary comb electrode system being situated on a second plane, the rotatable comb electrode system being attached to the mount via the torsion spring device, comb teeth of the rotatable comb electrode system being attached to the torsion spring system and dividing the torsion spring system into intermediate torsion springs and a length of comb teeth of the rotatable comb electrode system decreasing gradually, starting from a side of the mount along the rotation axis, thereby causing one rotation drive to be formed between two torsion springs in each case.

4. The cascaded micromechanical actuator structure as recited in claim 1, wherein the first rotary drive has a third rotatable comb electrode system and a third stationary comb electrode system cooperating therewith, the third rotatable comb electrode system being situated on a first plane and the third stationary comb electrode system being situated on a second plane, the second rotary drive having a fourth rotatable comb electrode system and a fourth stationary comb electrode system cooperating therewith, the fourth rotatable comb electrode system being situated on the first plane and the fourth stationary comb electrode system being situated on the second plane, and the fourth stationary comb electrode system being connected to the third rotatable comb electrode system via a first frame in such a way that it rotates together with the third rotatable comb electrode system on the first plane.

5. A cascaded micromechanical actuator structure for rotating a micromechanical component about a rotation axis, comprising:
   a torsion spring device which is attached to a mount and to which the micromechanical component is attachable, the torsion spring device having a plurality of torsion springs which run one of along or parallel to the rotation axis; and a rotary drive device having a plurality of rotary drives which are connected to the torsion spring device in such a way that each of the rotary drives is suitable for contributing a fraction to a total rotation angle of the micromechanical component about the rotation axis, wherein the torsion spring device has a third and a fourth torsion spring which are attached to the mount by respective first ends parallel to each other and parallel to the rotation axis, the rotary drive device having a third rotary drive which is attached to respective second ends of the third and fourth torsion springs, the torsion spring device having a fifth torsion spring which is attached to the mount by its first end, the rotary drive device having a fourth rotary drive which is attached to the second end of the fifth torsion spring.

6. The cascaded micromechanical actuator structure as recited in claim 5, wherein the third rotary drive has a fifth rotatable comb electrode system and a fifth stationary comb electrode system cooperating therewith, the fifth rotatable comb electrode system being situated on a first plane and the fifth stationary comb electrode system being situated on a second plane, the fourth rotary drive having a sixth rotatable comb electrode system and a sixth stationary comb electrode system cooperating therewith, the sixth rotatable comb electrode system being situated on the first plane and the sixth stationary comb electrode system being situated on the second plane, and the sixth stationary comb electrode system being connected to the fifth rotatable comb electrode system via a second frame in such a way that it rotates together with the fifth rotatable comb electrode system on the first plane.

7. The cascaded micromechanical actuator structure as recited in claim 6, wherein the fourth rotary drive has a seventh stationary comb electrode system and a seventh rotatable comb electrode system cooperating therewith, the seventh rotatable comb electrode system being situated on the first plane and the seventh stationary comb electrode system being situated on the second plane, and the seventh stationary comb electrode system being connected to the fifth rotatable comb electrode system via the second frame in such a way that it rotates together with the fifth rotatable comb electrode system on the first plane.

8. The cascaded micromechanical actuator structure as recited in claim 1, wherein the plurality of torsion springs have different spring constants.

9. The cascaded micromechanical actuator structure as recited in claim 1, wherein the micromechanical component is a micromirror.

10. The cascaded micromechanical actuator structure as recited in claim 1, wherein the rotary drive device has a plurality of electrodes which are dual electrodes on a first plane and a second plane and permit angular deflection in two directions.

11. The cascaded micromechanical actuator structure as recited in claim 3, wherein the micromechanical component is a micromirror.

12. The cascaded micromechanical actuator structure as recited in claim 3, wherein the rotary drive device has a plurality of electrodes which are dual electrodes on a first plane and a second plane and permit angular deflection in two directions.

13. The cascaded micromechanical actuator structure as recited in claim 5, wherein the micromechanical component is a micromirror.

14. The cascaded micromechanical actuator structure as recited in claim 5, wherein the rotary drive device has a plurality of electrodes which are dual electrodes on a first plane and a second plane and permit angular deflection in two directions.

* * * * *